(12) United States Patent
Pratap et al.

(10) Patent No.: US 9,547,037 B2
(45) Date of Patent: Jan. 17, 2017

(54) SYSTEM AND METHOD FOR EVALUATING A CAPACITIVE INTERFACE

(71) Applicant: FREESCALE SEMICONDUCTOR, INC., Austin, TX (US)

(72) Inventors: Divya Pratap, Chandler, AZ (US); Sung Jin Jo, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 172 days.

(21) Appl. No.: 14/184,659

(22) Filed: Feb. 19, 2014

(65) Prior Publication Data

US 2015/0233995 A1 Aug. 20, 2015

(51) Int. Cl.
*G01R 31/28* (2006.01)
*G01R 27/26* (2006.01)

(52) U.S. Cl.
CPC ....... *G01R 31/2829* (2013.01); *G01R 27/2605* (2013.01); *G01R 27/2688* (2013.01)

(58) Field of Classification Search
CPC ....................................................... G06F 3/044
See application file for complete search history.

(56) References Cited

U.S. PATENT DOCUMENTS

| | | | |
|---|---|---|---|
| 7,741,981 B1 * | 6/2010 | Wan | H03M 1/02 341/110 |
| 8,040,142 B1 * | 10/2011 | Bokma | H03K 17/955 324/658 |
| 8,416,216 B2 | 4/2013 | Zhang et al. | |
| 2002/0170399 A1 * | 11/2002 | Gass | B23D 59/001 83/62.1 |
| 2006/0186946 A1 * | 8/2006 | Hughes | H03K 17/165 327/427 |
| 2007/0018679 A1 | 1/2007 | Kim | |
| 2008/0068029 A1 | 3/2008 | Tanida et al. | |
| 2011/0018551 A1 * | 1/2011 | Yamane | E02F 9/2091 324/548 |
| 2011/0291665 A1 * | 12/2011 | Suzuki | G01R 31/028 324/548 |
| 2013/0113756 A1 * | 5/2013 | Kim | G06F 3/0416 345/174 |
| 2013/0221932 A1 | 8/2013 | Lee | |
| 2014/0285222 A1 * | 9/2014 | Tu | G01R 19/2503 324/679 |

* cited by examiner

*Primary Examiner* — Tung X Nguyen
*Assistant Examiner* — Feba Pothen

(57) ABSTRACT

A method of evaluating a capacitive interface including discharging the capacitive interface to a lower voltage, timing while applying a unit charge to the capacitive interface until a voltage of the capacitive interface rises to a reference voltage and determining a corresponding charge time value, charging the capacitive interface to an upper voltage that is greater than the reference voltage, and timing while removing the unit charge from the capacitive interface until a voltage of the capacitive interface falls to the reference voltage and determining a corresponding discharge time value. The charge and discharge time values may be used to evaluate the capacitive interface by determining capacitance and leakage current. The time values may be determined using a counter. A capacitive interface evaluation system for evaluating the capacitive interface may include a charge circuit, a comparator, a counter and a controller.

20 Claims, 6 Drawing Sheets (CHARGE TIME VS DISCHARGE TIME)

(CHARGE OPERATION)

(DISCHARGE OPERATION)

(CHARGE TIME VS DISCHARGE TIME)

SYSTEM AND METHOD FOR EVALUATING A CAPACITIVE INTERFACE

BACKGROUND OF THE INVENTION

Field of the Invention

The present disclosure relates generally to evaluating capacitive interfaces, and more specifically to a system and method for measuring capacitance and leakage current of a capacitive interface including one or more capacitive sensor devices and corresponding connections including wire bond or packaging and the like.

Description of the Related Art

Leakage current of capacitive sensor devices has been a significant problem. It has been difficult, for example, to measure capacitance when there is leakage current, or to measure the amount or the source of the leakage current. Conventional capacitance measurement is relatively inaccurate especially if there is leakage. Additionally, external probes may be used to measure capacitance before fabrication, but many issues occur after wire bonding and packaging that external probes are incapable of measuring. Leakage current may occur in the sensor device itself, in the connected integrated circuit (IC) control circuit, or in the wire bond or packaging of the sensor system.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

The present inventors have recognized that capacitance and leakage measurement is valuable after wire bonding and packaging for evaluating a capacitive interface. The present inventors have therefore developed a system and method for evaluating a capacitive interface including internally measuring capacitance and leakage current after fabrication to improve accuracy and testability. An evaluation system as described herein performs charging and discharging timing measurement using a unit capacitor or the like. The timing information may be used to make a capacitive measurement, to determine whether there is leakage current, and if so, to determine an amount of leakage and whether leakage occurs from ground or from the supply voltage. The determined information may then be used to screen parts and possibly determine causes of damage to improve the manufacturing process.

Figure 1:
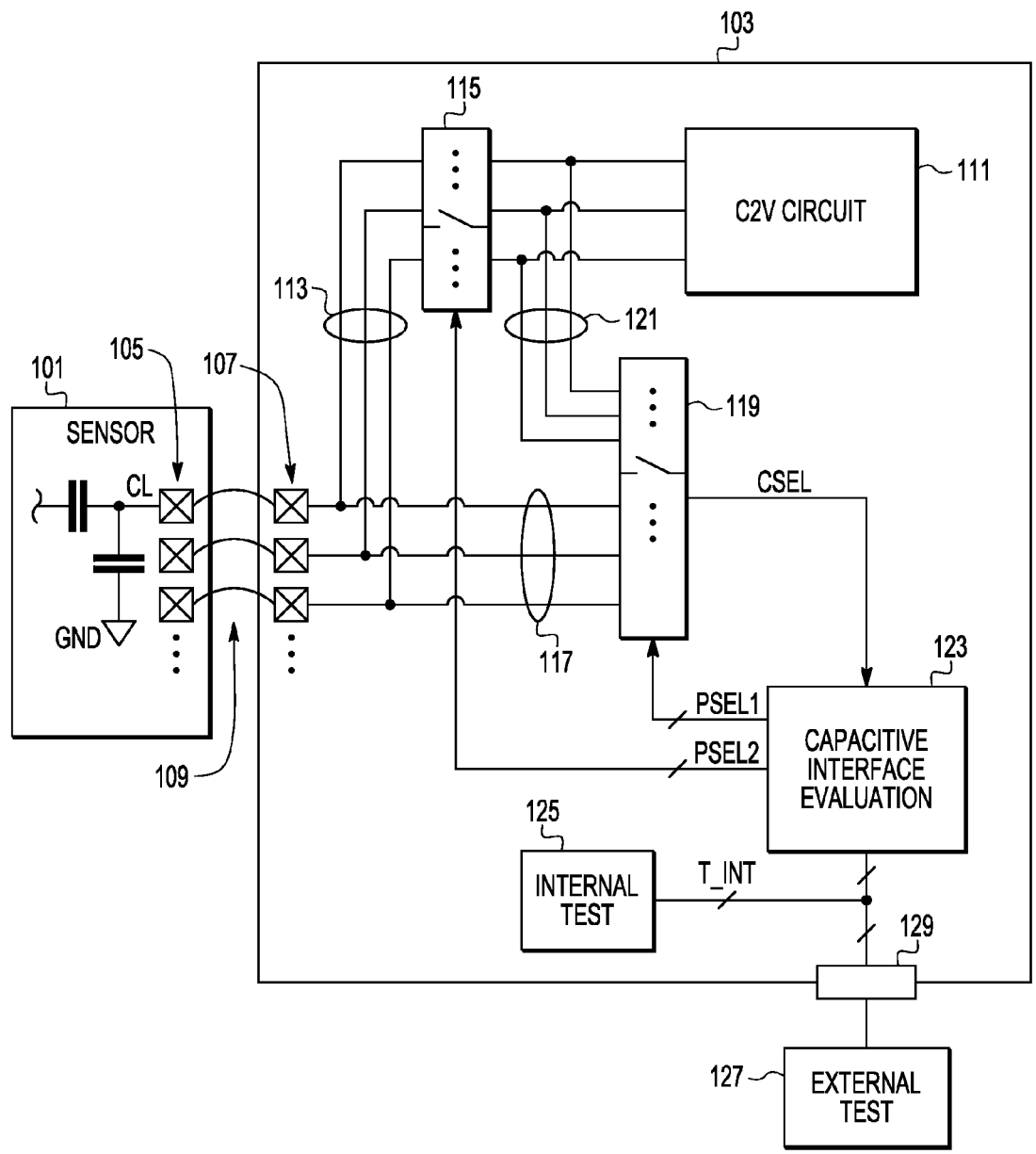
FIG. 1 is simplified block diagram of a sensor application including a capacitive measurement system implemented according to one embodiment.

FIG. 1 is simplified block diagram of a sensor application 100 including a capacitive interface evaluation system 123 implemented according to one embodiment. The sensor application 100 includes a capacitive sensor device 101 interfaced with an IC 103, such as an application-specific IC (ASIC) or the like. The capacitive sensor device 101 includes one or more capacitive sensors for sensing and/or measuring external physical stimulus based on the particular application. For example, the capacitive sensor device 101 may be implemented as an accelerometer, piezoelectric sensor, pressure sensor (air, blood, sound, etc.), gyroscope, microphone, touch display sensor, optical switch, etc. The capacitive sensor device 101 may be implemented as a micro-electro-mechanical system (MEMS) or a nano-electro-mechanical system (NEMS), which are typically configured using silicon, although other types of materials are contemplated, such as polymers, metals, ceramics, etc.

The capacitive sensor device 101 is configured to be compatible with the particular sensor application 100, which may be configured within or according to any one of many different types of commercial and/or consumer applications. Such applications are diverse and varied, such as, for a non-exhaustive list of examples, an accelerometer within a smart phone or airbag system or the like, a pressure sensor for measuring air pressure (such as a tire gauge) or blood pressure or the like, optical switches of an optical communication system, touch sensors of a touch display or the like, satellite sensor systems, etc.

The capacitive sensor device 101 is shown including one or more output pins 105 for interfacing external detection or conversion devices or the like. As shown, a first output pin 105 interfaces one or more capacitive sensors, collectively shown as a capacitance CL. Additional pins may be included for additional capacitors based on the particular application. An accelerometer, for example, includes at least one set of capacitors and corresponding pins for each of X, Y and Z axes. The IC 103 is configured with a compatible set of input pins 107, each for electrically interfacing a corresponding one of the pins 105 of the capacitive sensor device 101. In the illustrated embodiment, the electrical interface is implemented with one or more conductive wire bonds 109, each electrically connecting a corresponding pair of the pins 105 and 107.

The IC 103 includes a capacitance to voltage (C2V) circuit 111, which is conductively interfaced via a set of conductive traces 113 or the like with each of the pins 107. The C2V circuit 111 is implemented for the particular application, such as detectors or converters or the like, and is not further described. A set of switches 115 is interposed between the pins 107 and the C2V circuit 111 for selectively making (connecting) or breaking (disconnecting) each of the conductive traces 113 as further described herein. Another set of conductive traces 117 are provided between each of the pins 107 and another set of switches 119. Further, another set of traces 121 are provided between the traces 113 and corresponding ones of the switches 119 as further described herein.

A "capacitive interface" as described herein includes one set of one or more capacitors or capacitive sensors of the capacitive sensor device 101, the corresponding one of the pins 105 coupled to the capacitive set, the corresponding one of the pins 107 coupled to the corresponding pin 105 via a corresponding one of the wire bonds 107, and a corresponding one of the traces 113 or 117. The capacitive interface evaluation system "evaluates" each capacitive interface by measuring its capacitance and any leakage current. Each capacitive interface may be evaluated separately, although measurement may be performed in a multiplexed manner as further described herein. A given capacitive sensor device 101 may include multiple capacitive interfaces depending upon the particular implementation. For an accelerometer, for example, a first capacitive interface may be associated with an X axis, another capacitive interface may be associated with a Y axis, and another capacitive interface may be associated with a Z axis.

The capacitive interface evaluation system 123 asserts a set of select signals PSEL1 to the switches 119 to couple one of the conductive traces 117 and 121 to a conductive trace providing a selected capacitor interface value CSEL to an input of the capacitive interface evaluation system 123. For example, the capacitive interface evaluation system 123 asserts PSEL1 to electrically couple one of the pins 107 via conductive traces 117 for interfacing a corresponding one of the pins 105 for measuring a corresponding capacitance of the capacitive sensor device 101, or otherwise for measuring leakage current along the selected path as further described herein. The capacitive interface evaluation system 123 also asserts another set of select signals PSEL2 to the switches 115.

The capacitive interface evaluation system 123 may assert PSEL2 during normal operation to electrically connect each of the pins 107 to the C2V circuit 111 for normal capacitive sensing operation. The capacitive interface evaluation system 123 may also assert PSEL1 and PSEL2 to select one of the traces 113 and a corresponding one of the traces 121 to electrically couple a corresponding one of the pins 107 for interfacing a corresponding one of the pins 105 for measuring a corresponding capacitance of the capacitive sensor device 101, or otherwise for measuring leakage current along the selected path as further described herein. In this case, an alternative conductive path may be selected for capacitive and leakage measurement.

Alternatively, one or more internal capacitors (not shown) provided on the IC 103 may be measured by the capacitive interface evaluation system 123. For example, the capacitive interface evaluation system 123 asserts PSEL1 and PSEL2 to disconnect each of the pins 107 and the C2V circuit 111, and asserts other switch control signals (not shown) to connect to a corresponding one of the internal capacitors for measurement.

The capacitive interface evaluation system 123 is configured as described herein for measuring capacitance and leakage current of a selected capacitive interface as further described herein. In this manner, the capacitive interface evaluation system 123 is configured as a single point measurement block for measuring leakage current and capacitance of a selected one of one or more capacitive interfaces. In order to measure multiple capacitive interfaces, each may be selected one at a time. Alternatively, measurement may be performed in a multiplexed manner in which each capacitive interface is selected one at a time and coupled to a corresponding one of multiple counters as further described herein. Capacitance and leakage measurement operation may be controlled by the capacitive interface evaluation system 123. The capacitive interface evaluation system 123 may further be controlled by an internal test system 125 and/or an external test system 127, which are coupled together via test interface signals T_INT and an external interface 129 for coupling the external test system 127 to the IC 103. The internal test system 125 may be configured to perform other test operations, such as boundary scan operations, debug operations, calibration operations, built-in self test operations, etc.

Figure 2:
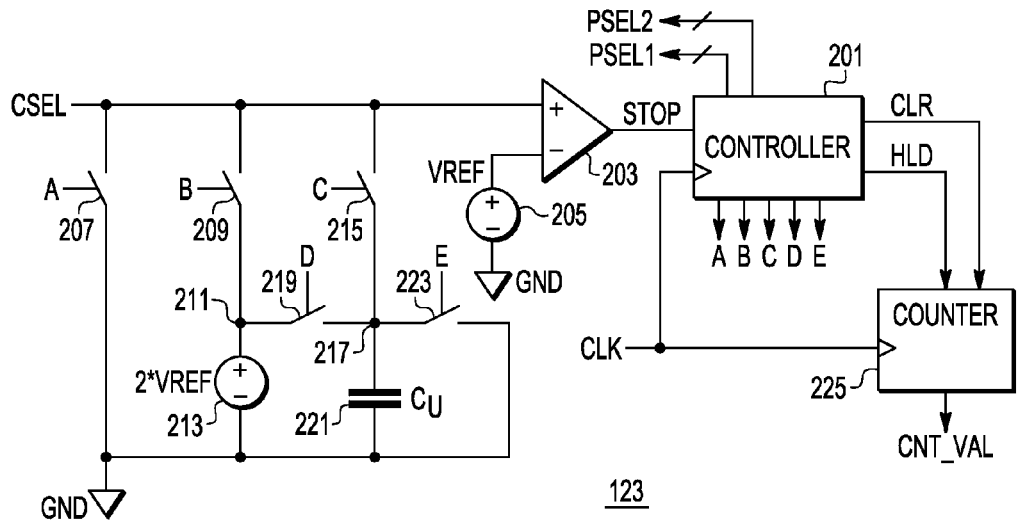
FIG. 2 is a schematic and block diagram of the capacitive measurement system of FIG. 1 implemented according to one embodiment.

FIG. 2 is a schematic and block diagram of the capacitive interface evaluation system 123 implemented according to one embodiment. The capacitive interface evaluation system 123 includes a controller 201 for controlling capacitance and leakage measurement operations. The controller 201 asserts the PSEL1 and PSEL2 signals as previously described for selecting and receiving the selected capacitor interface value CSEL. CSEL is provided to the positive (or non-inverting) input of a comparator 203, which receives a reference voltage VREF at its negative (or inverting) input. VREF may be developed by a voltage source 205 referenced to a supply voltage reference level, such as ground (GND). The comparator 203 has an output providing a stop signal STOP to an input of the controller 201.

The capacitive interface evaluation system 123 further includes a switch 207 that selectively couples CSEL to GND based on a control signal A. The capacitive interface evaluation system 123 further includes a switch 209 that selectively couples CSEL to a node 211 based on a control signal B. A voltage source 213 is coupled between a node 211 and GND and develops a voltage 2*VREF on node 211, which is twice the voltage level of VREF. Another switch 215 selectively couples CSEL to a node 217 based on a control signal C, and another switch 219 is coupled between nodes 211 and 219 and controlled by a control signal D. A unit capacitor 221, having a unit capacitance $C_U$, is coupled between node 217 and GND. Another switch 223 is coupled between node 217 and GND and is controlled by a control signal E. The capacitance $C_U$ of the unit capacitor 221 is relatively small compared to capacitance being measured as further described herein.

Each of the switches 207, 209, 215, 219 and 223 is shown as single-pole, single-throw (SPST) switch, which may be implemented as an electronic switch including one or more transistors or the like. The switches 207, 209, 215, 219 and 223 may be configured as normally open switches and the corresponding control signals A, B, C, D and E (A-E) are normally asserted low and are asserted high to close the corresponding switch. The controller 201 outputs the control signals A-E to control the state of the switches 207, 209, 215, 219 and 223 to perform capacitance and leakage measurement as further described herein.

The capacitive interface evaluation system 123 further includes a counter 225 for counting cycles of a clock signal CLK and developing and developing a corresponding count value CNT_VAL, shown as an output of the counter 225. CLK is provided to the clock inputs of the counter 225 and the controller 201. The controller 201 asserts counter control signals to the counter 225, including a clear signal CLR for clearing the CNT_VAL of the counter 225 to zero, and a hold signal HLD for temporarily holding CNT_VAL at its present value (e.g., temporarily ignoring CLK cycles). The CNT_VAL may be read by the internal test system 125 and/or the external test system 127. The counter 225 may be memory-mapped or the like so that the CNT_VAL may be read via a memory operation or the like.

Figure 3:
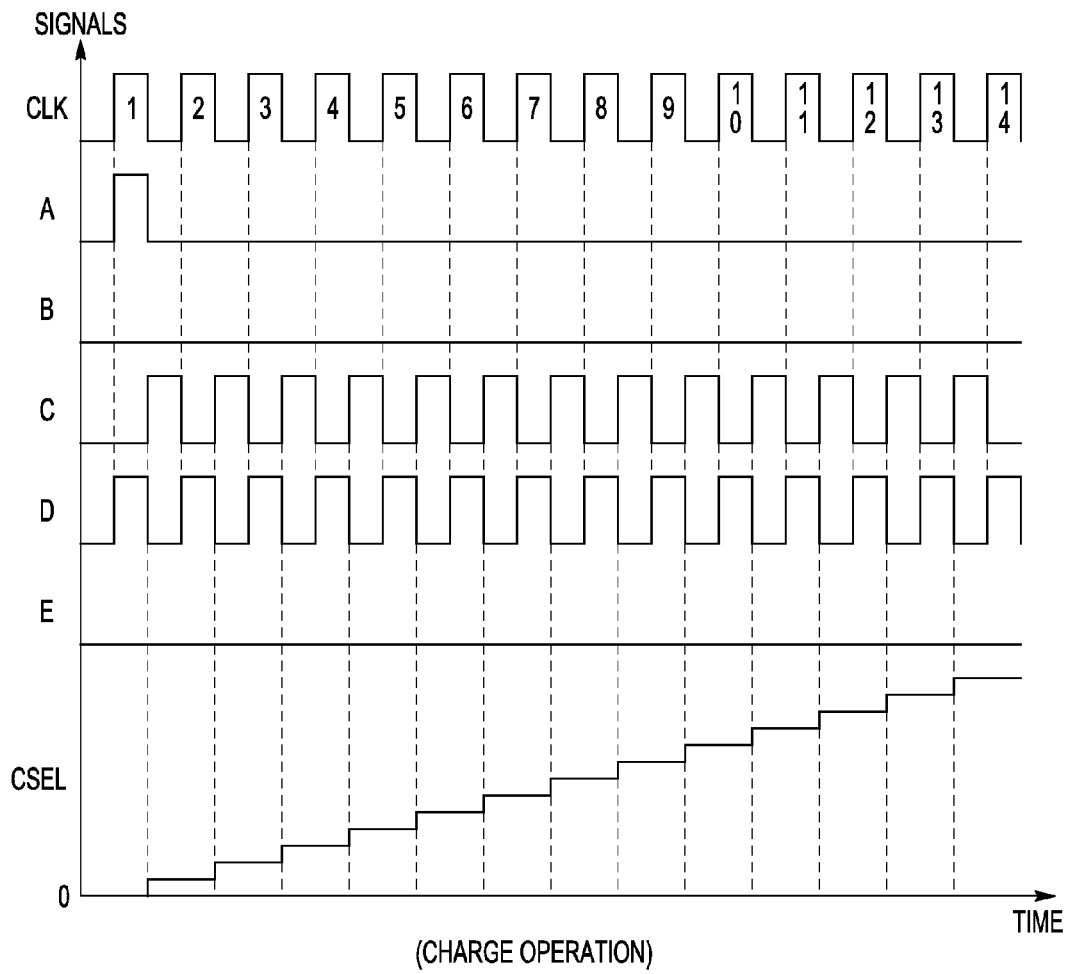
FIG. 3 is a simplified timing diagram illustrating operation of the capacitive measurement system of FIG. 2 for performing a charge operation.

FIG. 3 is a simplified timing diagram illustrating operation of the capacitive interface evaluation system 123 for performing a charge operation. The timing diagram plots cycles of CLK versus the A-E control signals and corresponding voltage of CSEL zoomed in at the beginning of the charge operation. Although not shown, before each charge operation, the controller 201 first asserts PSEL1 and PSEL2 to select a capacitive interface as CSEL for measurement, such as selecting the capacitance CL of the capacitive sensor device 101. Also, the controller 201 asserts the CLR signal to reset the counter 225 to zero out the count value CNT_VAL, and negates HLD so that cycles of CLK are counted by the counter 225.

The cycles of CLK are numbered with integer values beginning with CLK cycle 1, and for simplicity, the CLK is shown having a 50% duty cycle. The CLK signal, however, may have any suitable duty cycle other than 50%. The state of each of the control signals A-E are also shown for simplicity as being asserted coincident with transitions of the CLK signal. The duration of each control signal may be asserted high only as long as necessary to achieve the desired function, such as fully charging or discharging a corresponding capacitor or the like. Also, each control signal that is asserted is negated before assertion of another control signal to avoid overlap. For example, signals C and D are shown toggling to opposite states, in which C is negated before D is asserted and vice-versa.

For the charge operation, control signals B and E remain negated low so that switches 209 and 223 remain open. In the first CLK cycle, A is asserted high when CLK goes high to close switch 207 to connect CSEL to GND to fully discharge the capacitance of the selected capacitive interface interfaced as CSEL. Thus, CSEL is initially at GND or zero voltage level. Also, D is asserted high while CLK is high to close the switch 219 to charge the unit capacitor 221 by the voltage source 213 to the voltage level 2*VREF. When CLK goes low in the first CLK cycle, A and D both go low to re-open switches 207 and 219, and C is asserted high to close switch 215 to couple the unit capacitor 221 in parallel with the selected capacitive interface. The charge that is stored on the unit capacitor 221 is shared with the selected capacitive interface, so that CSEL increases by an incremental amount. A is held negated for the remainder of the charge operation.

In the next CLK cycle, when CLK goes high, C is pulled back low to re-open switch 215 and disconnect CSEL from the unit capacitor 221, while D is asserted high to re-close switch 219 to charge the unit capacitor 221 back up to the voltage level 2*VREF. When CLK next goes low in the second CLK cycle, D is pulled low to disconnect the unit capacitor 221 from the voltage source 213, and C is asserted back high to once again connect the charged unit capacitor 221 to CSEL. Again, the charge that is stored on the unit capacitor 221 is shared with the selected capacitive interface, so that CSEL again increases by an incremental amount. Although the unit capacitor 221 is relatively small compared to the capacitance of the selected capacitive interface, it is charged to a higher voltage level so that charge is transferred from the unit capacitor 221 to the selected capacitive interface to incrementally increase the voltage level of CSEL.

Operation repeats in this manner during successive cycles of CLK, in which the control signals C and D are repeatedly toggled to alternative states to recharge the unit capacitor 221 to the voltage level 2*VREF and then to reconnect the unit capacitor 221 to transfer additional charge to the selected capacitive interface. In this manner, during successive cycles of CLK, the voltage level of CSEL incrementally increases in stair-step fashion.

Figure 4:
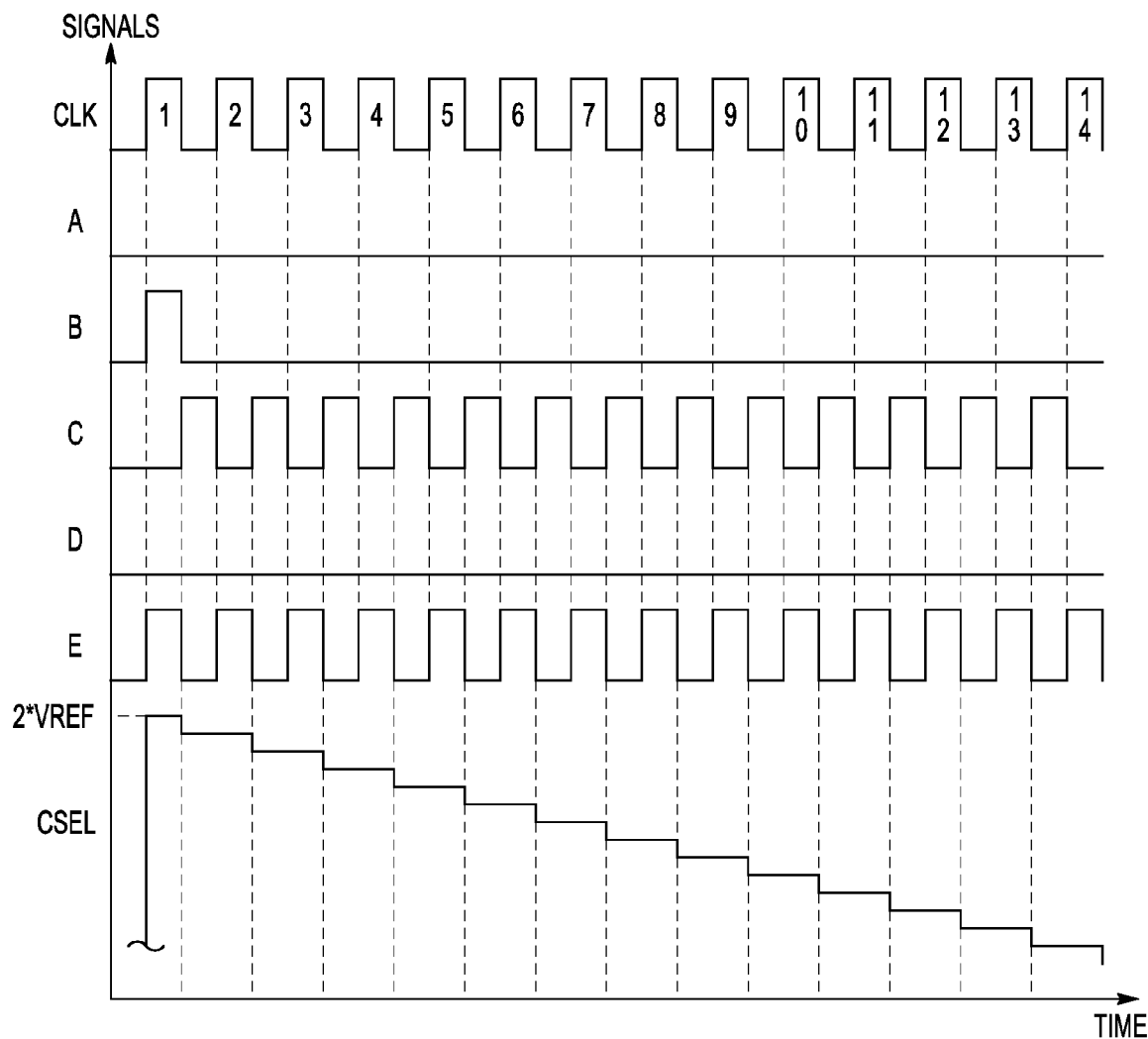
FIG. 4 is a simplified timing diagram illustrating operation of the capacitive measurement system of FIG. 2 for performing a discharge operation.

FIG. 4 is a simplified timing diagram illustrating operation of the capacitive interface evaluation system 123 for performing a discharge operation. The timing diagram plots cycles of CLK versus the A-E control signals and corresponding voltage of CSEL zoomed in at the beginning of the discharge operation. In a similar manner as described for the count operation, the controller 201 first asserts PSEL1 and PSEL2 to select a capacitive interface for measurement, such as selecting the capacitance CL of the capacitive sensor device 101 provided as CSEL. Also, the controller 201 asserts the CLR signal to reset the counter 225 to zero out the count value CNT_VAL, and negates HLD so that cycles of CLK are counted by the counter 225. The cycles of CLK are again numbered with integer values beginning with clock cycle 1 in similar manner previously described.

For the discharge operation, control signals A and D remain negated low so that switches 207 and 219 remain open. In the first CLK cycle, B is asserted high when CLK goes high to close switch 209 to connect CSEL to the voltage source 213 to fully charge the capacitance of the selected capacitive interface via CSEL to the upper voltage level 2*VREF. Also, E is asserted high while CLK is high to close the switch 223 to discharge the unit capacitor 221 to zero. When CLK goes low in the first CLK cycle, B and E both go low to re-open switches 209 and 223, and C is asserted high to close switch 215 to couple the unit capacitor 221 in parallel with the selected capacitive interface. The charge that is stored on the selected capacitive interface is shared with the unit capacitor 221, so that CSEL decreases by an incremental amount. B is held negated for the remainder of the discharge operation.

In the next CLK cycle, when CLK goes high, C is pulled back low to re-open switch 215 and disconnect CSEL from the unit capacitor 221, while E is asserted high to re-close switch 223 to fully discharge the unit capacitor 221. When CLK next goes low during the second CLK cycle, E is pulled low to disconnect the unit capacitor 221 from GND, and C is asserted back high to once again connect the charged unit capacitor 221 to CSEL. Again, the charge that is stored on the selected capacitive interface is shared with the unit capacitor 221, so that CSEL again decreases by an incremental amount.

Operation repeats in this manner during successive cycles of CLK, in which the control signals C and E are repeatedly toggled to alternative states to fully discharge the unit capacitor 221 and then to reconnect the unit capacitor 221 to transfer additional charge from the selected capacitive interface. In this manner, during successive cycles of CLK, the voltage level of CSEL incrementally decreases in stair-step fashion.

Figure 5:
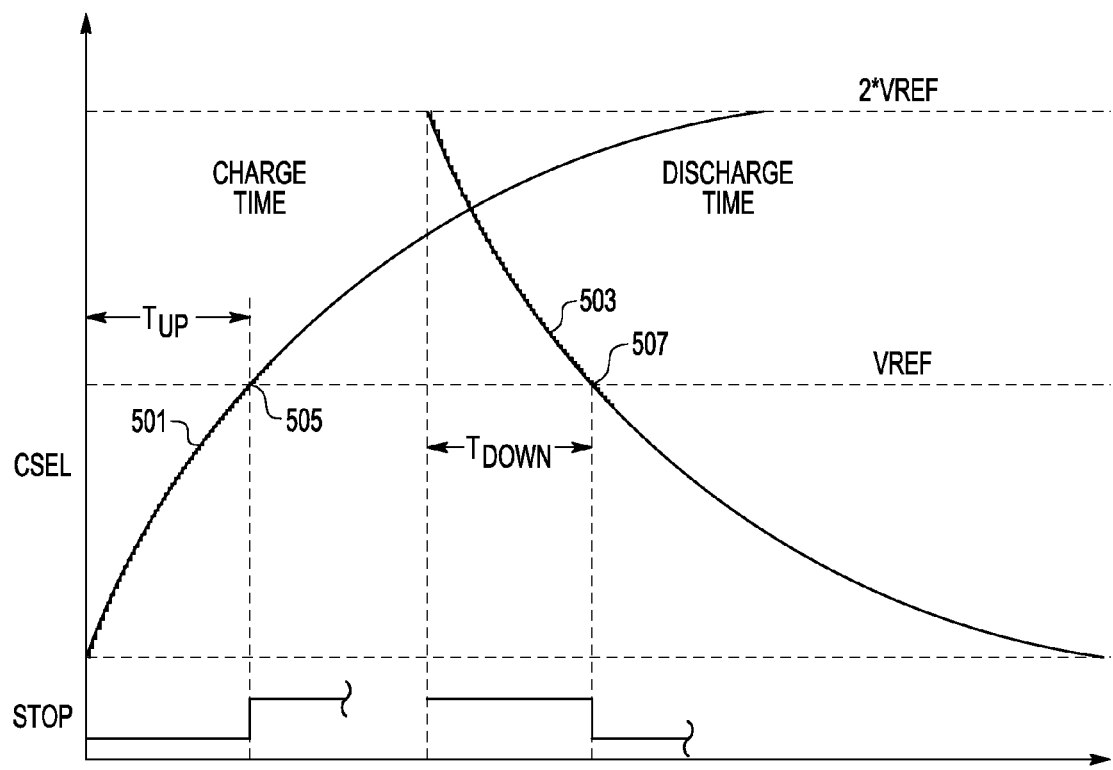
FIG. 5 is a timing diagram plotting CSEL for a full charge curve for determining a charge time, and for a full discharge curve for determining a discharge time.

FIG. 5 is a timing diagram plotting CSEL for a full charge curve 501 for determining a charge time $T_{UP}$, and for a full discharge curve 503 for determining a discharge time $T_{DOWN}$. As described herein, a counter is used to count a clock signal (e.g., CLK) for timing the charge and discharge operations to provide the charge time $T_{UP}$ and the charge time $T_{DOWN}$ as count values indicative of elapsed time. Alternative timing methods may be used in different implementations for timing charging and discharging and determining corresponding time values. The STOP signal at the output of the comparator 203 is also plotted coincident with both curves 501 and 503. As shown by the charge curve 501 during a charge operation, as the unit capacitor 221 is repeatedly charged and then connected to the selected capacitive interface, CSEL incrementally increases with successive cycles of CLK. When CSEL reaches VREF as shown at 505, the comparator 203 switches pulling STOP high. When STOP goes high, the controller 201 re-asserts the HLD signal to stop the counter 225 so that CNT_VAL indicates the charge time $T_{UP}$.

As shown by the discharge curve 503, as the unit capacitor 221 is repeatedly discharged and then connected to the selected capacitive interface, CSEL incrementally decreases with successive cycles of CLK. When CSEL falls to VREF as shown at 507, the comparator 203 switches pulling STOP low. When STOP goes low, the controller 201 re-asserts the HLD signal to stop the counter 225 so that CNT_VAL indicates the discharge time $T_{DOWN}$.

In general, since the frequency of CLK is known, the charge time $T_{UP}$ is determined by dividing the number of clock cycles that it takes for CSEL to increase from 0 Volts (V) to VREF by the frequency of CLK. The corresponding CNT_VAL developed in the counter 225 represents the charge time $T_{UP}$, which may then be stored or converted. Also, the discharge time $T_{DOWN}$ is determined by dividing the number of clock cycles that it takes for CSEL to decrease from 2*VREF to VREF by the frequency of CLK. The corresponding CNT_VAL developed in the counter 225 represents the discharge time $T_{DOWN}$, which may then be stored or converted in similar manner.

In a more specific embodiment, the frequency of CLK is $F_{CLK}$=1 Mega-Hertz (MHz), so that each cycle of CLK is 1/1 MHz=1 microsecond (µs) in duration. If CNT_VAL is a number 70, then the charge or discharge time ($T_{UP}$ or $T_{DOWN}$) is 70 µs. Assuming that there is no leakage current from a supply voltage VDD for to GND, then the discharge time $T_{DOWN}$ should be approximately the same as the charge time $T_{UP}$. As further described herein, if $T_{UP}$ and $T_{DOWN}$ are not equal, then leakage current exists. The relative values of $T_{UP}$ and $T_{DOWN}$ may be used to determine the primary source of the leakage current, such as from VDD or to GND. The capacitance of the selected capacitive interface (or selected capacitor) may be determined using the average value of $T_{UP}$ and $T_{DOWN}$, or $(T_{UP}+T_{DOWN})/2$.

Figure 6:
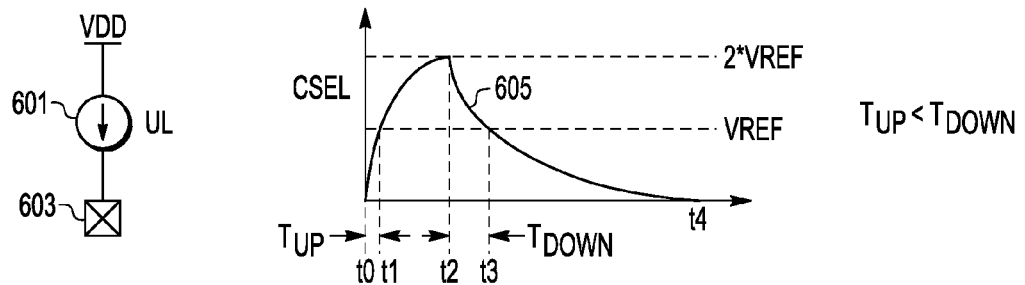
FIG. 6 illustrates the effect of a current leak from the supply voltage VDD on both the charge and discharge operations.

FIG. 6 illustrates the effect of a current leak from the supply voltage VDD on both the charge and discharge operations. A current source 601 sourcing an upper leakage current UL is shown coupled between VDD and a pin 603. The pin 603 represents any one of the pins 105 of the capacitive sensor device 101 or any one of the pins 107 of the IC 103, but more generally represents leakage from VDD to any one or more locations along the selected capacitive interface, including the selected conductive traces (e.g., 113, 117, 121). It is noted that UL may represent a net current leakage in which there may be a combination of leakage current from VDD and leakage current to GND, in which the leakage current from VDD is dominant or otherwise greater than the leakage current to GND.

A corresponding charge/discharge curve 605 of CSEL is shown illustrating the effect of the upper leakage current UL on both the charge and discharge operations. The charge/discharge curve 605 first charges from zero at a time t0 all the way to 2*VREF at a time t2, in which $T_{UP}$ is measured from time t0 to an intermediate time t1 when the charge reaches VREF as previously described. Although the charge operation need not charge all the way to 2*VREF for measuring $T_{UP}$, curve 605 is shown up to 2*VREF for purposes of illustration. At time t2, a discharge operation starts in which the charge/discharge curve 605 discharges from 2*VREF down to zero at about a time t4. $T_{DOWN}$ is measured from time t2 to an intermediate time t3 when the charge falls to VREF as previously described. As described more fully below, the upper leakage current UL decreases $T_{UP}$ and increases $T_{DOWN}$, so that $T_{UP}<T_{DOWN}$.

Figure 7:
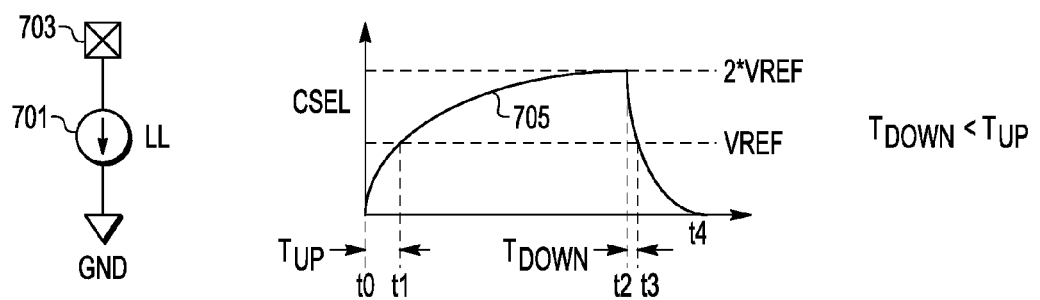
FIG. 7 illustrates the effect of a current leak to GND on both the charge and discharge operations.

FIG. 7 illustrates the effect of a current leak to GND on both the charge and discharge operations. A current source 701 sinking a lower leakage current LL is shown coupled between a pin 703 and GND. The pin 703 represents any one of the pins 105 of the capacitive sensor device 101 or any one of the pins 107 of the IC 103, but generally represents leakage to GND from any one or more locations along the selected capacitive interface, including the selected conductive traces (e.g., 113, 117, 121). It is noted that LL may represent a net current leakage in which there may be a combination of leakage current from VDD and leakage current to GND, in which the leakage current to GND is dominant or otherwise greater than the leakage current from VDD.

A corresponding charge/discharge curve 705 of CSEL is shown illustrating the effect of the lower leakage current LL on the charge and discharge operations. The charge/discharge curve 705 first charges from zero at a time t0 all the way to 2*VREF at a time t2, in which $T_{UP}$ is measured from time t0 to an intermediate time t1 when the charge reaches VREF as previously described. At time t2, a discharge operation starts in which the charge/discharge curve 705 discharges from 2*VREF down to zero at about a time t4. $T_{DOWN}$ is measured from time t2 to an intermediate time t3 when the charge falls to VREF as previously described.

As illustrated by the curve 605 of FIG. 6, the additional contribution of UL to charge CSEL causes $T_{UP}$ to decrease and $T_{DOWN}$ to increase. In this manner, when $T_{UP}<T_{DOWN}$, then it is known that net leakage current is from VDD. Alternatively, as illustrated by the curve 705 of FIG. 7, the additional contribution of LL to charge CSEL causes $T_{UP}$ to increase and $T_{DOWN}$ to decrease. In this manner, when $T_{UP}>T_{DOWN}$, then it is known that net leakage current is to GND. Since the leakage current is common to both measurements, then $T_{UP}$ and $T_{DOWN}$ both change by a time difference in which one decreases and the other increases by about the same time difference.

The charging curve of the capacitive interface may be determined based on the following general equation (1):

$$V_{UP}(t)=V_H(1-e^{-t/RC_M})+R^*I_{LEAK} \qquad (1)$$

where "t" denotes time, $V_{UP}$ is the charge voltage, $V_H$ is the upper voltage level, R is resistance, "e" is the mathematical constant that is the base of the natural logarithm, $C_M$ is the capacitance of the capacitive interface, and $I_{LEAK}$ is the leakage current. The discharging curve of the capacitive interface may be determined based on the following general equation (2):

$$V_{DOWN}(t)=V_H(e^{-t/RC_M})+R^*I_{LEAK} \qquad (2)$$

The resistance R for a switched capacitor configuration is based on the unit capacitance $C_U$ and the frequency $F_{CLK}$ of CLK according to the following equation (3):

$$R = \frac{1}{F_{CLK}*C_U} \qquad (3)$$

Equation (1) may be evaluated at time $t=T_{UP}$ for the charging operation in which $V_{UP}(T_{UP})$=VREF, $V_H$=2*VREF, and equation (3) is substituted for R. Equation (2) may be evaluated at time $t=T_{DOWN}$ in a similar manner in which $V_{DOWN}(T_{DOWN})$=VREF and $V_H$=2*VREF. For a selected capacitive interface, a charge operation is performed for measuring $T_{UP}$ and a discharge operation is performed for measuring $T_{DOWN}$. If $T_{UP}=T_{DOWN}$, then there is no leakage current so that $I_{LEAK}=0$. If $T_{UP}$ and $T_{DOWN}$ are not the same, then the leakage current is not zero. Nonetheless, if there is leakage current, then a measured time value $T_M$ may be determined as the average value of the measured values of $T_{UP}$ and $T_{DOWN}$, or $T_M=(T_{UP}+T_{DOWN})/2$. The capacitance $C_M$ may be approximated using equation (3) for R, substituting into equation (2) and solving for $C_M$ using the following equation (4):

$$C_M = \frac{-T_M * F_{CLK} * C_U}{\ln\left(\frac{VREF}{2*VREF}\right)} \quad (4)$$

where "ln" is the natural logarithm. Of course, VREF/2*VREF=0.5, but is shown to illustrate that different values may be used for the reference voltage levels during the charge and discharging operations. The natural logarithm of 0.5 is ln(0.5)~–0.7, which may be substituted into equation (4). In one embodiment, $F_{CLK}$ is 1 MHz, and the unit capacitance $C_U$ may be a relatively small value, such as 100 Femto-Farads (fF).

When $T_{UP}$ is not equal to $T_{DOWN}$ so that there is leakage current, then the above equations may be used to solve for $I_{LEAK}$ if desired. As noted above, $T_{UP}$ and $T_{DOWN}$ both change by the same time difference. The polarity of the leakage current determines whether the leakage current is either UL or LL. It is noted, however, that if any level of leakage current is detected, then the capacitive interface is compromised and the part may be discarded.

Figure 8:
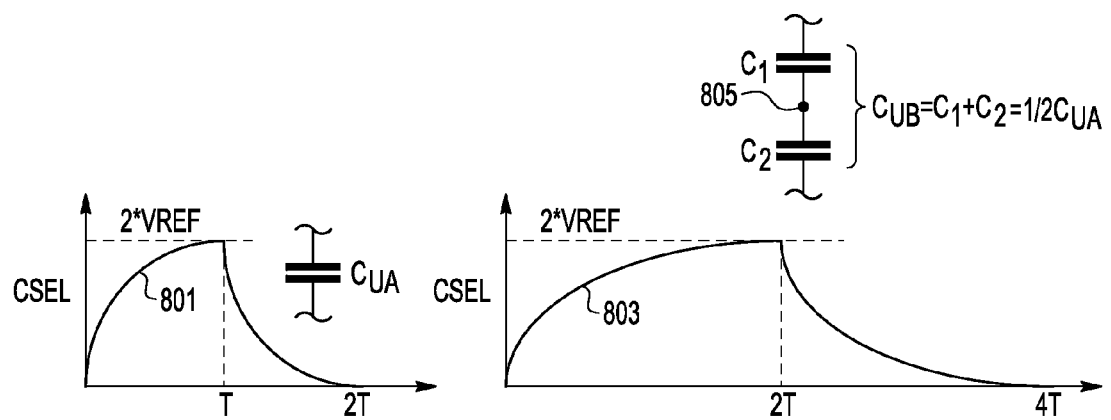
FIG. 8 is a pair of timing diagrams illustrating the effect of reducing the unit capacitance $C_U$.

FIG. 8 is a pair of timing diagrams illustrating the effect of reducing the unit capacitance $C_U$. A first graph plots a curve 801 for a unit capacitance $C_{UA}$ (and no leakage current) for full back-to-back charge and discharge operations. In this case, the voltage of CSEL reaches 2*VREF at a time T and fully discharges by about twice time T or 2T. The unit capacitance may be reduced simply by coupling multiple capacitors in series. It is noted that the unit capacitance should be substantially smaller than the measured capacitance of CSEL for any selected capacitive interface. However, very small capacitors may be difficult to fabricate on an integrated circuit. Instead, rather than attempting to implement a smaller unit capacitor, two or more smaller capacitors may be implemented in series to reduce the unit capacitance to any suitable or desired unit capacitance.

As shown in FIG. 8, a second graph plots a curve 803 for the case in which the unit capacitance is decreased to $C_{UB}=\frac{1}{2} C_U$ for full back-to-back charge and discharge operations. As illustrated, a pair of capacitors $C_1$ and $C_2$ in series, in which $C_{UB}=C_1+C_2$, wherein $C_1$ and $C_2$ may or may not be equal to each other. In this case for $C_{UB}=\frac{1}{2} C_U$, the voltage of CSEL reaches 2*VREF at time 2T and fully discharges by about twice time 2T or 4T. Although only two capacitors are shown, any number of capacitors may be connected in series to reduce the unit capacitance and increase accuracy. When integrated in silicon on a chip, each of the intermediate unit capacitor nodes, such as node 805 in FIG. 8, may be set by external devices to a set voltage for IC voltage protection if desired.

Figure 9:
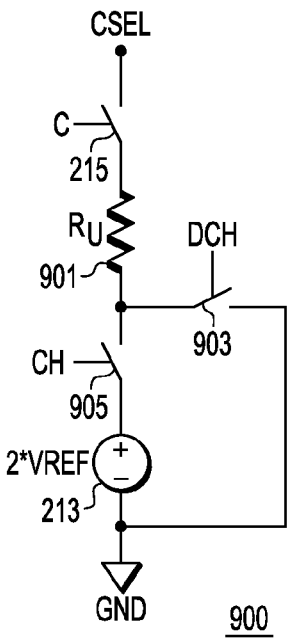
FIGS. 9 and 10 are schematic diagrams of alternative charge device configurations.

The unit capacitor configuration may be implemented using alternative charge and discharge components, such as resistors or current sources or the like. As shown by the schematic diagram of FIG. 9, for example, the unit capacitor 221 may be replaced by a unit resistor 901 with "unit" resistance $R_U$ coupled between the switch 215 and one switched terminal each of two switches 903 and 905. The other switched terminal of switch 905 is coupled to the positive terminal of the voltage source 213 and has a control input receiving a charge signal CH. The other switched terminal of switch 903 is coupled to GND and has a control input receiving a discharge signal DCH. Although not shown in FIG. 9, another switch (e.g., switch 207) is provided to couple CSEL to GND to fully discharge CSEL for the charge operation, and another switch (e.g., switch 209) is provided to couple CSEL to the voltage source 213 to pre-charge CSEL to the upper voltage (e.g., 2*VREF) for the discharge operation.

The controller 201 is configured to provide the CH and DCH signals for controlling the charge and discharge operations. For the charge operation, DCH is held low while CH is held high to close switch 905 and signal C is toggled in similar manner previously described to repeatedly connect/disconnect the voltage source 213 and the resistor 901 to/from CSEL. For the discharge operation, CH is held low while DCH is held high to close switch 903 and signal C is toggled in similar manner previously described to repeatedly connect/disconnect CSEL to/from GND via the resistor 901. The "unit" resistance $R_U$ of the unit resistor 901 is selected to deliver a unit charge for each cycle of CLK. The charge and discharge curves are developed in similar manner.

Figure 10:
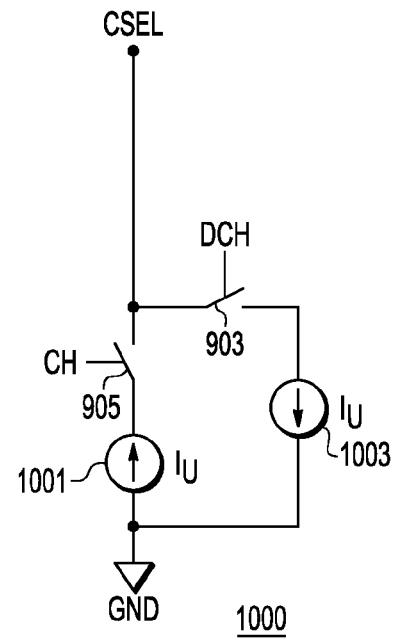

As shown by the schematic diagram of FIG. 10, the unit capacitor 221 may be replaced by unit current devices 1001 and 1003 each developing a "unit" current $I_U$. In this case, one switched terminal of each of the switches 903 and 905 is coupled to CSEL. The other switched terminal of switch 905 is coupled to the positive terminal of the current device 1001, having its negative terminal coupled to GND. The other switched terminal of switch 903 is coupled to the negative terminal of the current device 1003, having its positive terminal coupled to GND. The switches 903 and 905 are controlled by control signals DCH and CH, respectively. Although not shown in FIG. 10, another switch (e.g., switch 207) is provided to couple CSEL to GND to fully discharge CSEL for the charge operation, and another switch (e.g., switch 209) is provided to couple CSEL to the voltage source 213 to pre-charge CSEL to the upper voltage (e.g., 2*VREF) for the discharge operation.

Again, the controller 201 is configured to provide the CH and DCH signals for controlling the charge and discharge operations. For the charge operation, DCH is held low while CH is held high to close switch 905. In this case, the current device 1001 continuously charges CSEL with the unit current $I_U$ until STOP is asserted. For the discharge operation, CH is held low while DCH is held high to discharge CSEL with the unit current $I_U$ until STOP is asserted. The "unit" current $I_U$ is designed to deliver a unit charge for each cycle of CLK. The charge and discharge curves are developed in similar manner, except in continuous manner rather than stair-step manner. The current devices 1001 and 1003 may be replaced by a single current device with additional switching for charge and discharge operations.

Although not shown, many other switched and non-switched configurations are possible using alternative charge and discharge components and configurations.

Figure 11:
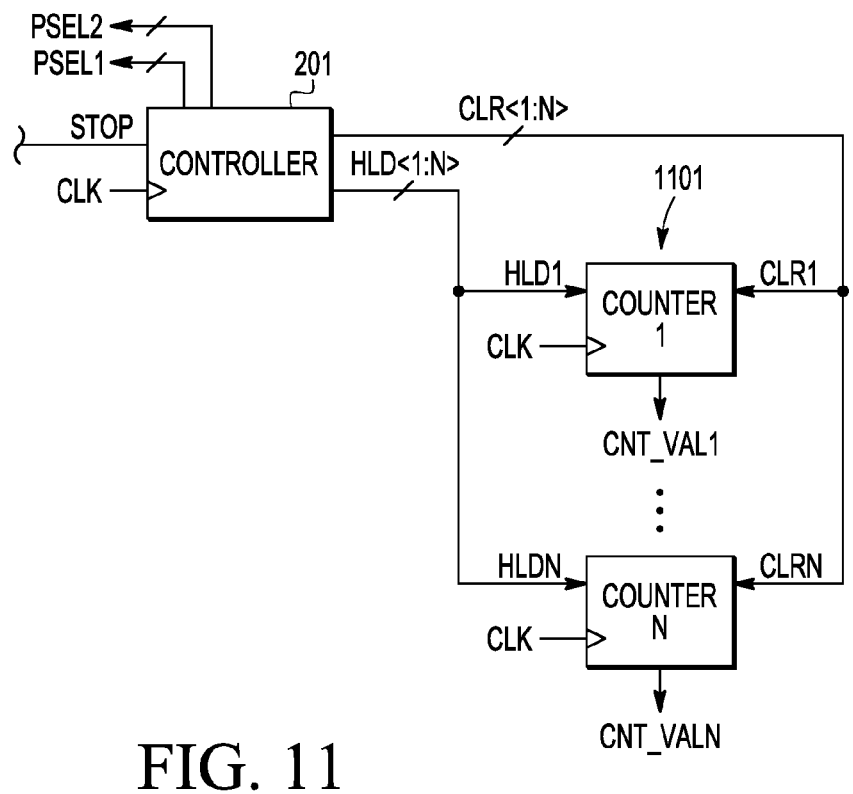
FIG. 11 is a block diagram illustrating an alternative embodiment including multiple counters for taking multiple measurements, either individually or in parallel.

FIG. 11 is block diagram illustrating an alternative embodiment including a number N of counters 1101, shown individually as COUNTER 1, ..., COUNTER N, providing a corresponding N count values CNT_VAL1, ..., CNT_VALN. In this case, the controller 201 asserts N clear signals CLR<1:N> and N hold signals HLD<1:N>, in which CLR1 and HLD1 are provided to control the first counter COUNTER 1 and so on up to CLRN and HLDN provided to control the last counter COUNTER N. The controller 201 may perform up to N charge or discharge operations at a time. In one operational configuration, the controller 201 completes each charge or discharge operation before initiating the next for any number of capacitive interfaces. In an alternative operational configuration, the controller 201 performs the operations on different capacitive interfaces in parallel by multiplexing up to N counters at a time.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of evaluating a capacitive interface, the method comprising:
    discharging the capacitive interface to a lower voltage level that is less than a reference voltage level by a predetermined voltage difference;
    timing while applying a unit charge to the capacitive interface until a voltage of the capacitive interface rises to the reference voltage level from the lower voltage level and determining a corresponding charge time value;
    charging the capacitive interface to an upper voltage level that is greater than the reference voltage level by the predetermined voltage difference;
    timing while removing the unit charge from the capacitive interface until a voltage of the capacitive interface falls from the upper voltage level to the reference voltage level and determining a corresponding discharge time value; and
    determining whether leakage current exists in the capacitive interface based on the charge time value compared with the discharge time value.

2. The method of claim 1, wherein said timing while applying a unit charge and determining a corresponding charge time value comprises:
    disconnecting a unit capacitor from the capacitive interface;
    charging the unit capacitor to the upper voltage level;
    connecting the unit capacitor to the capacitive interface for charge sharing; and
    repeating cycles of said disconnecting, charging, and connecting at a predetermined rate while counting a number of cycles of a clock until the voltage of the capacitive interface rises to the reference voltage level and providing a count value indicative of the charge time value.

3. The method of claim 1, wherein said timing while applying a unit charge and determining a corresponding charge time value comprises applying a unit charge current to the capacitive interface while counting a number of cycles of a clock signal until the voltage of the capacitive interface rises to the reference voltage level and providing a count value indicative of the charge time value.

4. The method of claim 1, wherein said timing while removing a unit charge and determining a corresponding discharge time value comprises:
    disconnecting a unit capacitor from the capacitive interface;
    discharging the unit capacitor to the lower voltage level;
    connecting the unit capacitor to the capacitive interface for charge sharing; and
    repeating cycles of said disconnecting, discharging, and connecting at a predetermined rate while counting a number of cycles of a clock signal until the voltage of the capacitive interface falls from the upper voltage level to the reference voltage level and providing a count value indicative of the discharge time value.

5. The method of claim 1, wherein said timing while removing a unit charge and determining a corresponding discharge time value comprises drawing a unit charge current from the capacitive interface while counting a number of cycles of a clock signal until the voltage of the capacitive interface falls to the reference voltage level and providing a count value indicative of the discharge time value.

6. The method of claim 1, wherein said charging comprises connecting a voltage source and a resistor to the capacitive interface, and wherein said discharging comprises connecting a resistor to the capacitive interface.

7. The method of claim 1, further comprising determining a capacitance of the capacitive interface using an average of the charge time value and the discharge time value.

8. The method of claim 1, further comprising determining an amount of leakage current based on at least one of the charge time value and the discharge time value.

9. The method of claim 1, further comprising determining a direction of leakage current based on relative values of the charge time value with the discharge time value.

10. The method of claim 1, further comprising connecting to one of a plurality of capacitive interfaces.

11. An evaluation system for evaluating a capacitive interface, the evaluation system comprising:
    a charge circuit for selectively charging and discharging the capacitive interface;
    a comparator that compares a voltage of the capacitive interface with a reference voltage, wherein said reference voltage is greater than a low voltage by a predetermined voltage difference and is less than an upper voltage by the predetermined voltage difference;
    a counter; and
    a controller that controls said charge circuit, said comparator, and said counter to perform a measurement operation by charging the capacitive interface from said low voltage to said reference voltage to provide a charge count value, and by discharging the capacitive interface from said upper voltage to said reference voltage to provide a discharge count value, wherein said controller determines whether leakage current exists in the capacitive interface based on said charge count value compared with said discharge count value.

12. The evaluation system of claim 11, wherein said controller is configured to control said charge circuit to discharge the capacitive interface to a minimum level, and to initiate said counter and control said charge circuit to apply a unit charge to the capacitive interface until said comparator circuit indicates that said voltage of the capacitive interface has risen to said reference voltage, wherein said counter provides said charge count value.

13. The evaluation system of claim 11, wherein said controller is configured to control said charge circuit to charge the capacitive interface to said upper voltage, and to initiate said counter and control said charge circuit to remove said unit charge from the capacitive interface until said comparator circuit indicates that said voltage of the capacitive interface has fallen to said reference voltage, wherein said counter provides said discharge count value.

14. The evaluation system of claim 11, wherein said charge circuit comprises:
   a voltage source;
   a unit capacitor; and
   a plurality of switches, including a first switch for selectively coupling the capacitive interface to ground, a second switch for selectively coupling the capacitive interface to said voltage source, a third switch for selectively coupling the capacitive interface to said unit capacitor, a fourth switch for selectively coupling said unit capacitor to said voltage source, and a fifth switch for selectively coupling said unit capacitor to ground.

15. The evaluation system of claim 14, wherein said controller is configured to toggle said third and fourth switches at a frequency of a clock signal to selectively apply said unit charge to the capacitive interface, and wherein said counter counts cycles of said clock signal to provide said charge count value.

16. The evaluation system of claim 14, wherein said controller is configured to toggle said third and fifth switches at a frequency of a clock signal to selectively remove said unit discharge from the capacitive interface, and wherein said counter counts cycles of said clock signal to provide said discharge count value.

17. The evaluation system of claim 11, wherein said charge circuit comprises:
   a voltage source;
   at least one current source; and
   a plurality of switches, including a first switch for selectively coupling the capacitive interface to ground, a second switch for selectively coupling the capacitive interface to said voltage source, and at least one third switch for selectively coupling the capacitive interface to said at least one current source.

18. The evaluation system of claim 17, wherein said controller controls said at least one third switch to connect said at least one current source to charge the capacitive interface, and wherein said counter counts cycles of said clock signal to provide said charge count value, and wherein said controller controls said at least one third switch to connect said at least one current source to discharge the capacitive interface, and wherein said counter counts cycles of said clock signal to provide said discharge count value.

19. The evaluation system of claim 11, wherein said charge circuit comprises a voltage source, a resistor, and at least one switch controlled by said controller.

20. The evaluation system of claim 11, further comprising a plurality of switches controlled by said controller for selectively connecting one of a plurality of capacitive interfaces.

* * * * *